US006247968B1

United States Patent
Wu

(12) United States Patent
(10) Patent No.: US 6,247,968 B1
(45) Date of Patent: Jun. 19, 2001

(54) ELECTRICAL CARD DEVICE HAVING EMI SHIELD

(75) Inventor: Kun-Tsan Wu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/213,093

(22) Filed: Dec. 15, 1998

(30) Foreign Application Priority Data

Dec. 15, 1997 (TW) .................................................. 86220910

(51) Int. Cl.[7] ....................................................... H05K 1/14
(52) U.S. Cl. ........................................... 439/607; 361/737
(58) Field of Search ................................. 439/76.1, 946; 361/737, 818, 816

(56) References Cited

U.S. PATENT DOCUMENTS

| | | | | |
|---|---|---|---|---|
| 5,053,613 | * | 10/1991 | Onoda .................................... | 235/492 |
| 5,183,404 | * | 2/1993 | Aldous et al. ........................ | 439/131 |
| 5,207,586 | * | 5/1993 | MacGregor et al. ................... | 439/76 |
| 5,245,509 | * | 9/1993 | Seitz ..................................... | 361/720 |
| 5,299,940 | * | 4/1994 | Uenaka et al. ......................... | 439/76 |
| 5,469,332 | * | 11/1995 | Alvite .................................... | 361/737 |
| 5,472,351 | * | 12/1995 | Greco et al. ........................... | 439/353 |
| 5,499,162 | * | 3/1996 | Bartuska et al. ....................... | 361/737 |
| 5,673,181 | * | 9/1997 | Hsu ....................................... | 361/818 |
| 5,754,404 | * | 5/1998 | Biermann et al. ..................... | 361/737 |
| 5,902,991 | * | 5/1999 | Kumar .................................. | 235/492 |
| 5,920,460 | * | 7/1999 | Oldendorf et al. .................... | 361/737 |
| 6,008,994 | * | 12/1999 | Bates ..................................... | 361/737 |

FOREIGN PATENT DOCUMENTS 296 07 724 U * 8/1996 (DE) .

* cited by examiner

Primary Examiner—Neil Abrams
(74) Attorney, Agent, or Firm—Wei Te Chung

(57) ABSTRACT

An electrical card device for use with a palmtop computer includes a dielectric housing (2) forming a first frame portion (21) and a second frame portion (22) extending from a side of the first frame portion (21). The first frame portion (21) is mounted with a first connector (6) for connecting with a connector of a peripheral device, and the second frame portion (22) is provided with a second connector (5) for connecting with a PCMCIA card connector within a receiving slot of a palmtop computer. An EMI shield (4) is assembled to the dielectric housing (2) for ensuring high speed, noiseless signal transmission. The shields (4A, 4B) include skirt portions (41a, 42a, 43a, 44a) for being received in retaining slots (21a, 21b, 22a) in the frame (2) and tabs (41b, 43b) that pass through openings (21b) in the frame for conductive engagement with one another to electrically interconnect the shields (4A, 4B). One of the shields (4B) includes mounting lugs (43C) for conductive attachment, by screws (62a) to a connector shroud (62). The first frame portion (21) is enlarged to provide a space for a thick D-sub connector (6) therein.

2 Claims, 6 Drawing Sheets

ELECTRICAL CARD DEVICE HAVING EMI SHIELD

FIELD OF THE INVENTION

The present invention relates to an electrical card device, and more particularly to an electrical card device having an EMI shield for ensuring noiseless signal transmission.

DESCRIPTION OF THE PRIOR ART

Mini-notebook and palmtop computers are newly developed portable devices which are smaller than notebook computers. However, the small size makes it difficult to find a location on a sidewall thereof to install input/output ports. In light of this, the capacity for connecting to peripherals has been greatly hindered. Basically, the mini-notebook and palmtop computers are equipped with a receiving slot for insertion of a PCMCIA card. In order to expand its capacity, each PCMCIA card is provided with a receptacle connector opposite a plug connector which connects a mating connector within the receiving slot. Accordingly, mini-notebook and palm computers may connect with other peripherals, such as a monitor or a printer. U.S. Pat. Nos. 5,207,586, 5,244,397, and 5,330,360 disclose such I/O cards.

However, the thickness of the PCMCIA card is too small to install a connector which is compatible with existing peripherals, such as a D-sub connector of the printer. As a result, the usage of the mini-notebook and palmtop computers is limited. Even existing PCMCIA cards are equipped with an EMI shield, noiseless signal transmission can not be ensured when connected to a monitor.

SUMMARY OF THE INVENTION

An objective of this invention is to provide an electrical card device suitable for connecting a mini-notebook computer to a peripheral device.

Another objective of this invention is to provide an electrical card device having an EMI shield for ensuring noiseless, high-speed signal transmission.

In order to achieve the objectives set forth, an electrical card device in accordance with the present invention includes a dielectric housing forming a first frame portion and a second frame portion extending from a side of the first frame portion. The first frame portion is mounted with a first connector for connecting with a connector of a peripheral device, and the second frame portion is provided with a second connector for connection with a PCMCIA card connector within a receiving slot of a palmtop computer. An EMI shield is assembled to the housing for ensuring high speed, noiseless signal transmission.

These and additional objects, features, and advantages of the present invention will become apparent after reading the following detailed description of the preferred embodiment of the invention taken in conjunction with the appended drawings.

DETAILED DESCRIPTION OF PREFERRED EMBODIMENT

Figure 1:
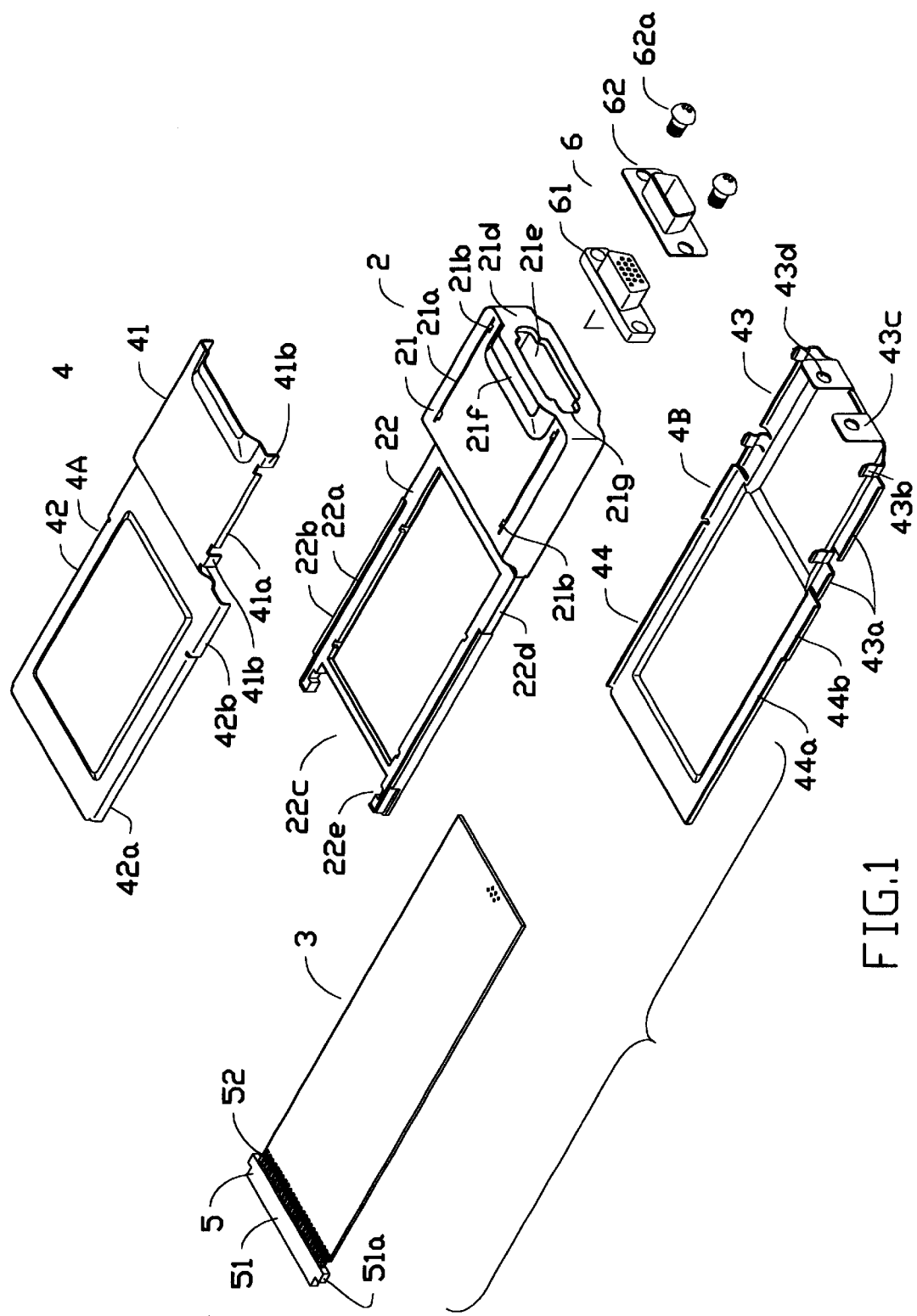
FIG. 1 is an exploded view of an electrical card device in accordance with the present invention.
Figure 2:
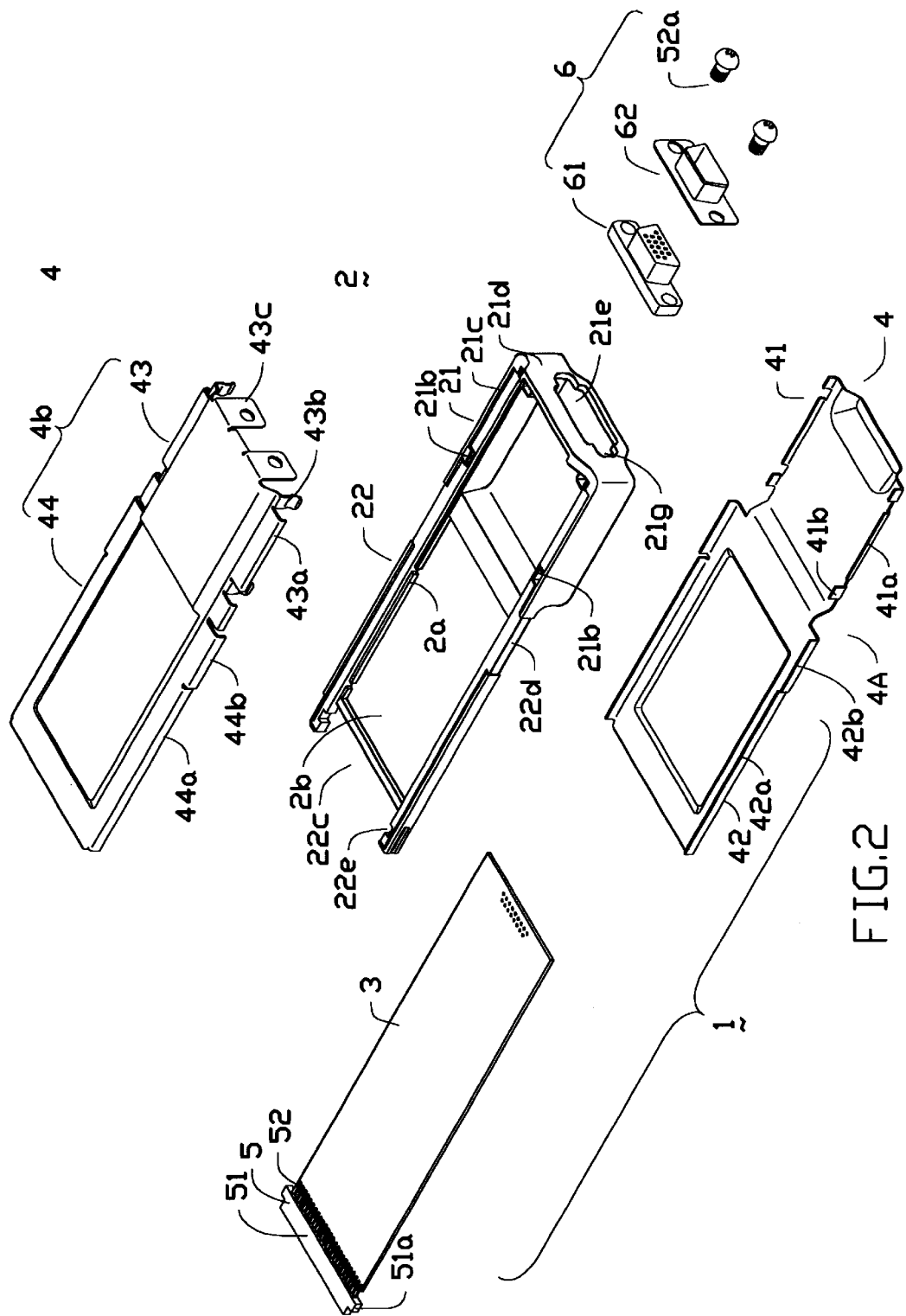
FIG. 2 is a bottom view of FIG. 1.
Figure 3:
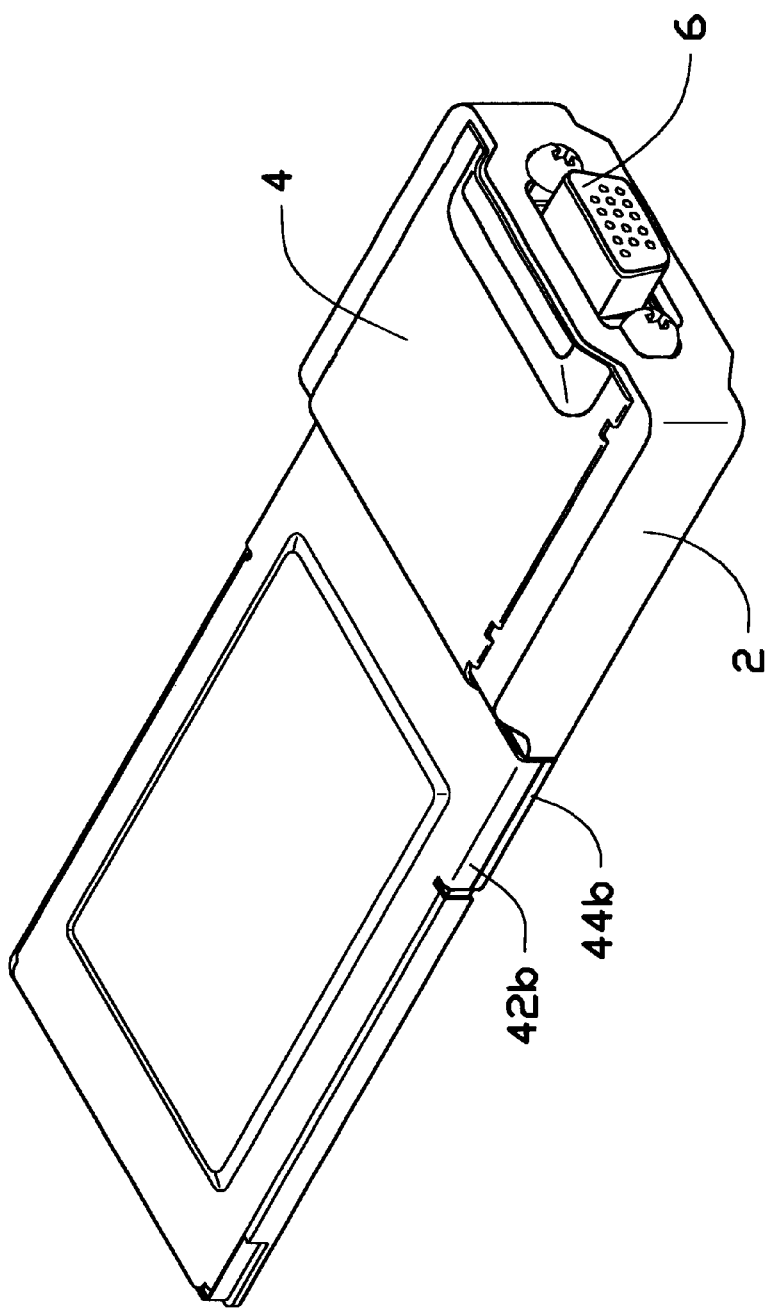
FIG. 3 is an assembled view of the electrical card device of FIG. 1.

Referring to FIGS. 1 to 3, an electrical card device 1 in accordance with a preferred embodiment of the present invention comprises a dielectric housing 2, a printed circuit board 3, an EMI shield 4, a memory card connector 5 connected to one end of the PCB 3, and a D-sub connector 6 connected to the other end of the PCB 3.

The housing 2 forms a first frame portion 21 and a second frame portion 22 extending from a side of the first frame portion 21. The first frame portion 21 forms a raised plateau defining a space therein. A pair of top retaining slots 21a are defined in the first frame portion 21. Each slot 21a is further defined with an opening 21b at an end thereof. A pair of bottom retaining slots 21c are defined in transverse sides of the first frame portion 21. An end wall 21d of the first frame portion 21 defines an opening 21e for protrusion of the D-sub connector 6 therethrough. The opening 21e is further defined with a pair of slots 21g at opposite ends thereof. The first frame portion 21 forms an embossed portion 21f for enclosing the D-sub connector 6.

The second frame portion 22 defines a pair of retaining slots 22a on traverse sides thereof through the thickness of the housing 2. A pair of dam portions 22b are integrally formed on edges of the second frame portion 22 adjacent to the retaining slot 22a. A receiving socket 22c is defined at an end of the second frame portion 22 for receiving the memory card connector 5 therein. The receiving socket 22c is defined with a pair of positioning recesses 22e in sidewalls thereof. The second frame portion 22 defines a retaining notch 22d for retention of the EMI shield 4.

The EMI shield 4 includes an upper shield 4a and a lower shield 4b. The upper shield 4a includes a first upper section 41 and a second upper section 42 corresponding to the first frame portion 21 and the second frame portion 22. The first upper section 41 includes a skirt portion 41a extending downward therefrom. The first upper section 41 further forms four contacting tabs 41b extending from sides of the first upper section 41. Each contacting tab 41b may extend through the opening 21b into the inner space of the first frame portion 21. The skirt portion 41a is securely retained within the retaining slot 21a when the upper shield 4a is seated onto the housing 2.

The second upper section 42 of the upper shield 4a forms skirt portions 42a extending downward from traverse sides thereof. A contacting flange 42b adjacent to the skirt portion 42a extends downward therefrom for engaging with the retaining notch 22d of the second frame portion 22, wherein the contacting flange 42b is not coplanar with the skirt portion 42a.

The lower shield 4b includes a first lower section 43 and a second lower section 44 corresponding to the first frame portion 21 and the second frame portion 22. The first lower section 43 includes skirt portions 43a extending upward from transverse sides thereof and each can be received within the retaining slot 21c of the first frame portion 21. The first lower section 43 further forms four contacting tabs 43b extending from the transverse sides and each is separated from the skirt portion 43a. Each contacting tab 43b extends through the corresponding opening 21b into the inner space of the first frame portion 21 for electrical engagement with the contacting tab 43b of the first frame portion 21. The skirt portion 43a is retained within the retaining slot 21c when the lower shield 4b is seated onto the housing 2. The first lower portion 43 further forms a pair of mounting lugs 43c upwardly extending therefrom toward the first frame portion 21 at an end thereof. Each mounting lug 43c includes a through hole 43d for engagement with a locking screw 62a of the D-sub connector 62. The second lower section 44 of the lower shield 4b forms skirt portions 44a extending upward from traverse ends thereof. A contacting flange 44b adjacent to the skirt portion 44a extends upward therefrom for engaging with the retaining notch 22d of the upper EMI shield 4a. When both the upper and lower shields 4a and 4b assembled to the housing 2, the contacting flanges 42b, 44b and the contacting tabs 41b, 43b are electrically engaged with each other thereby providing a complete shield to EMI.

The bottom of the first frame portion 21 is coplanar with the bottom of the second frame portion 22 is coplanar and forms elongate ribs 2a thereon to define a receiving seat (not labeled) for receiving of the printed circuit board 3 therein. The memory card connector 5 is installed at one end, and the D-sub connector 6 is installed at the other end.

The memory card connector 5 includes a dielectric housing 51 defining a plurality of passageways (not labeled) therein. Each passageway receives a terminal 52 for electrical connection with the printed circuit board 3. The housing 51 includes a pair of retaining wedges 51a extending from traverse ends thereof. The retaining wedges 51 are retained within the corresponding positioning recesses 22e of the receiving socket 22c when the printed circuit board 3 is assembled to the receiving seat 2b.

The D-sub connector 6 includes an insulative housing 61 and a metal shroud 62 assembled to the housing 61. The locking screws 62a are used to securely attach the housing 61 and the shroud 62 to the mounting lugs 43c of the lower shield 4b. As a result, a grounding path between the connector 6 and the lower shield 4b is established.

Figure 5:
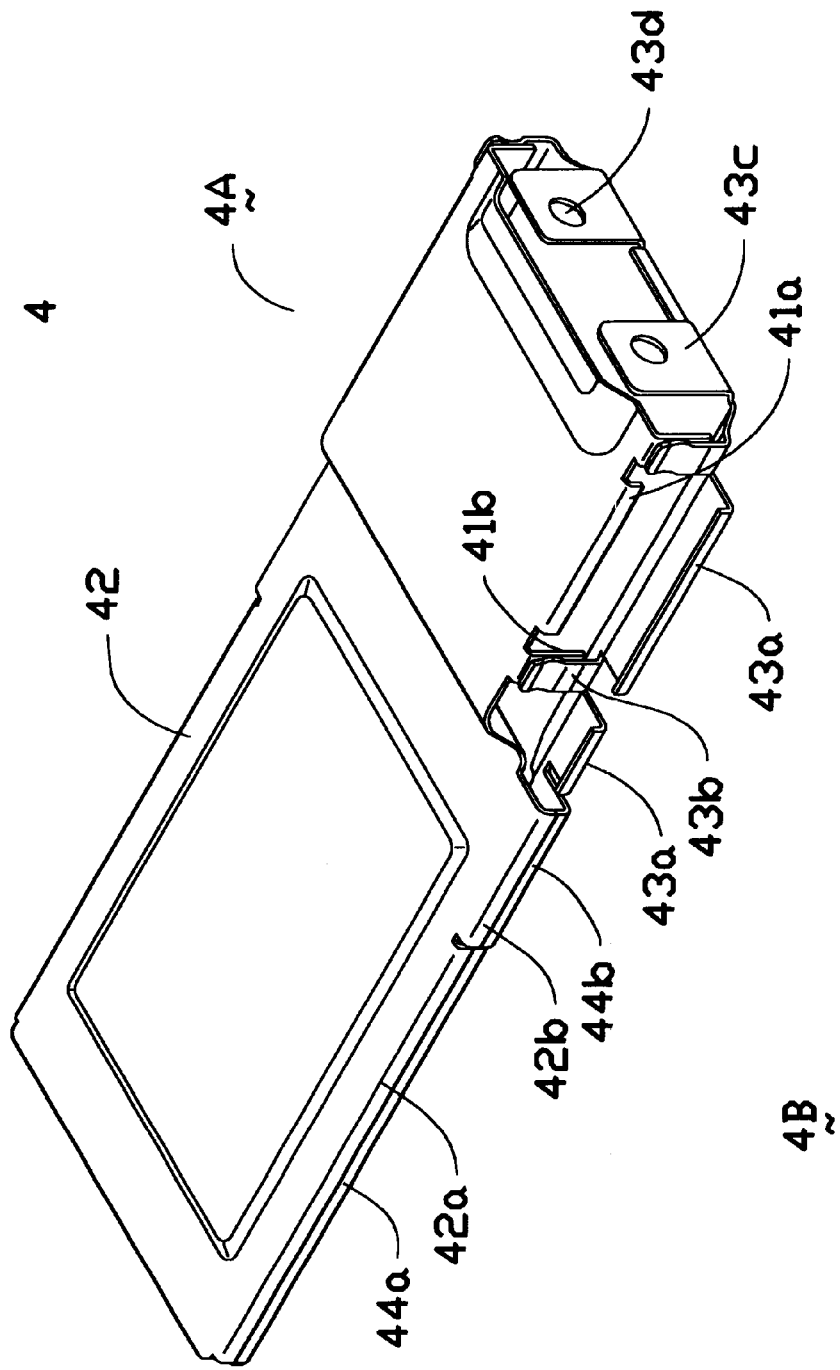
FIG. 5 is an assembled view of the EMI shield showing the engagement between upper and lower shields.

In assembly, the memory card connector 5 and the D-sub connector 6 are assembled to the printed circuit board 3. The printed circuit board 3 is assembled to the receiving seat 2b of the housing 2 such that the retaining wedges 5 1a are retained by the positioning recesses 22e of the receiving socket 22c. The lower shield 4b is assembled to the housing 2 from the bottom thereof whereby the skirt portions 44a are securely retained within the retaining slots 21c, respectively. After the lower shield 4b is securely seated, the locking screws 62a are engaged with the through holes 43d through the slots 21g such that the shroud 62 is electrically connected with the mounting lugs 43c. Finally, the upper shield 4a is assembled to the housing 2 whereby the skirt portions 41a and 43a are securely retained within the retaining slots 21a and 22a, respectively. The contacting tabs 41b of the upper shield 4a extend through the openings 21b into the inner space of the first frame portion 21 and electrically engage with the contacting tabs 43b of the lower shield 4b, as clearly shown in FIG. 5.

Figure 4:
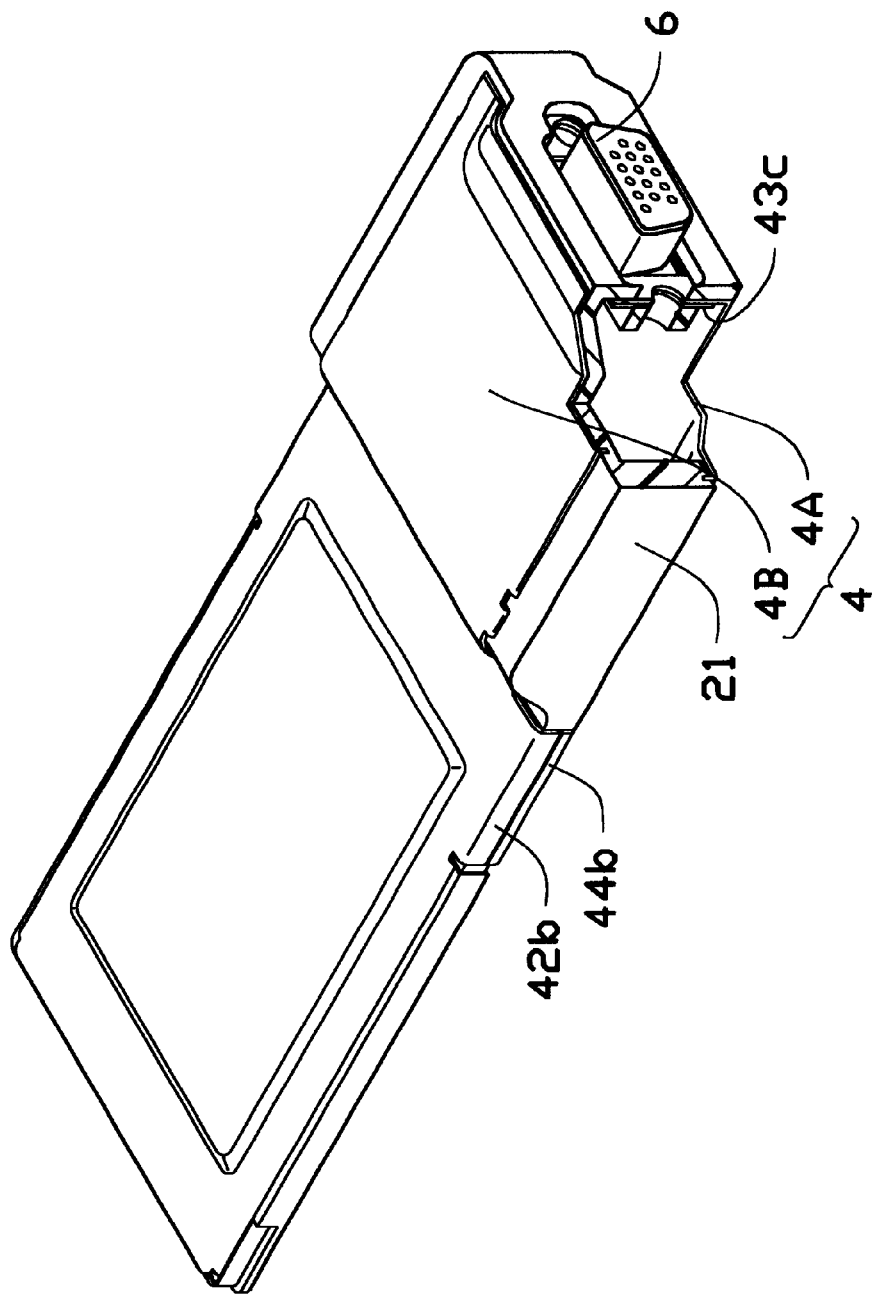
FIG. 4 a cutaway view of FIG. 3.

After the upper shield 4a is assembled, the dam portion 22b is flush with an upper face of the upper shield 4a. Thus the EMI shield 4 is engagement with the housing 2, as seen in FIG. 4.

Figure 6:
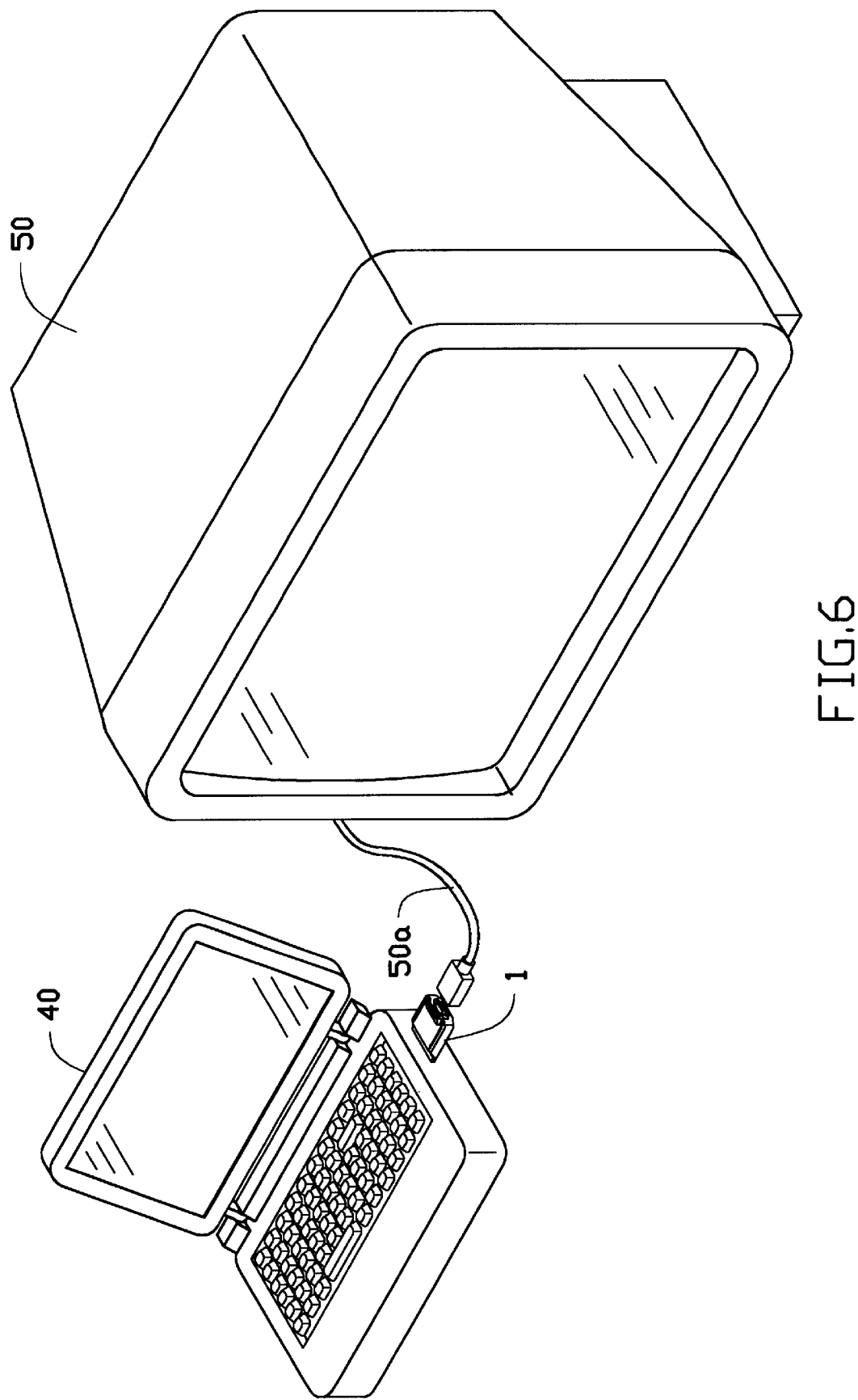
FIG. 6 is a perspective view of a palmtop computer electrically connected to a monitor by the electrical card device.

By the provision of the electrical card device 1, the palmtop computer 40 may readily communicate with a monitor 50 through a connecting cord 50a, as seen in FIG. 6.

It is noted that he invention discloses a card device 1 with EMI shield 4 wherein the housing 2 includes a first frame portion 21 with a raised portion defining a space for receiving a thicker D-sub connector 6 therein, and a second frame portion 22 on the opposite side. The end wall 21d of the first frame 21 defines an opening 21e for allowing D-sub connector 6 to protrude outward wherein the opening 21e is restrainedly surrounded by the end wall 21 so as to enhance the engagement between the first frame portion 21 and the connector 6. Additionally, the connector 6 may be reinforced by securing to the mounting lugs 43c through the locking screw 62a. This structure and the corresponding assembling method, and the associated application condition and/or effect are far different from those of the conventional plane type I/O card.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. An electrical card device comprising:

a dielectric housing forming a first frame portion and a second frame portion extending from a side of the first frame portion for respectively receiving connectors with different thicknesses, said first frame portion forming a raised portion defining a space for receiving a thicker connector therein, said first frame portion including an end wall peripherally defining a restrained opening for allowing said connector to only extend outward, wherein an EMI shield is attached to the housing and said shield includes mounting lugs for securement with the connector through screws that interconnect the lugs and the connector.

2. An electrical card device comprising:

a dielectric housing forming a first frame portion and a second frame portion extending from a side of the first frame portion for respectively receiving different thickness connectors, said first frame portion defining a thicker space for receiving a thicker connector therein;

an EMI shield attached to the housing; and means for securing the connector and the shield together;

wherein said means includes at least a mounting lug integrally formed with the shield and extending into the space, and further includes at least a locking screw extending through and interconnecting the connector and the mounting lug.

\* \* \* \* \*